United States Patent [19]

Woo et al.

[11] Patent Number: 5,268,064
[45] Date of Patent: Dec. 7, 1993

[54] COPPER CLAD EPOXY PRINTED CIRCUIT BOARD SUITABLE FOR MICROWAVE FREQUENCIES ENCOUNTERED IN GPS RECEIVERS

[75] Inventors: Arthur N. Woo, Cupertino; Paul K. Tom, Saratoga, both of Calif.

[73] Assignee: Trimble Navigation Limited, Sunnyvale, Calif.

[21] Appl. No.: 830,733

[22] Filed: Feb. 4, 1992

[51] Int. Cl.$^5$ .......................... B44C 1/22; C23F 1/00
[52] U.S. Cl. .................................... 156/630; 156/634; 156/656; 156/666; 156/902
[58] Field of Search ............... 156/630, 634, 651, 656, 156/659.1, 661.1, 666, 902; 174/255, 256, 258, 259; 428/209, 901; 134/26, 28; 29/846

[56] References Cited

U.S. PATENT DOCUMENTS

| | | | |
|---|---|---|---|
| 3,177,103 | 4/1965 | Tally et al. | 156/902 X |
| 4,659,425 | 4/1987 | Eggers et al. | 156/630 |
| 4,902,556 | 2/1990 | Benedikt et al. | 428/209 |
| 4,917,758 | 4/1990 | Ishizuka et al. | 156/902 |

Primary Examiner—William A. Powell
Attorney, Agent, or Firm—Thomas E. Schatzel

[57] ABSTRACT

A method for making printed circuit boards comprises using double treated copper foils for all inside conductor layers of multilayer packages with substrates of alloys of epoxy and polyphenylene oxide (PPO) resin to counteract the skin-effect encountered at high frequencies. Direct bonds between inside surfaces are then used without using an oxide step that introduces red/brown or black oxides.

4 Claims, 2 Drawing Sheets

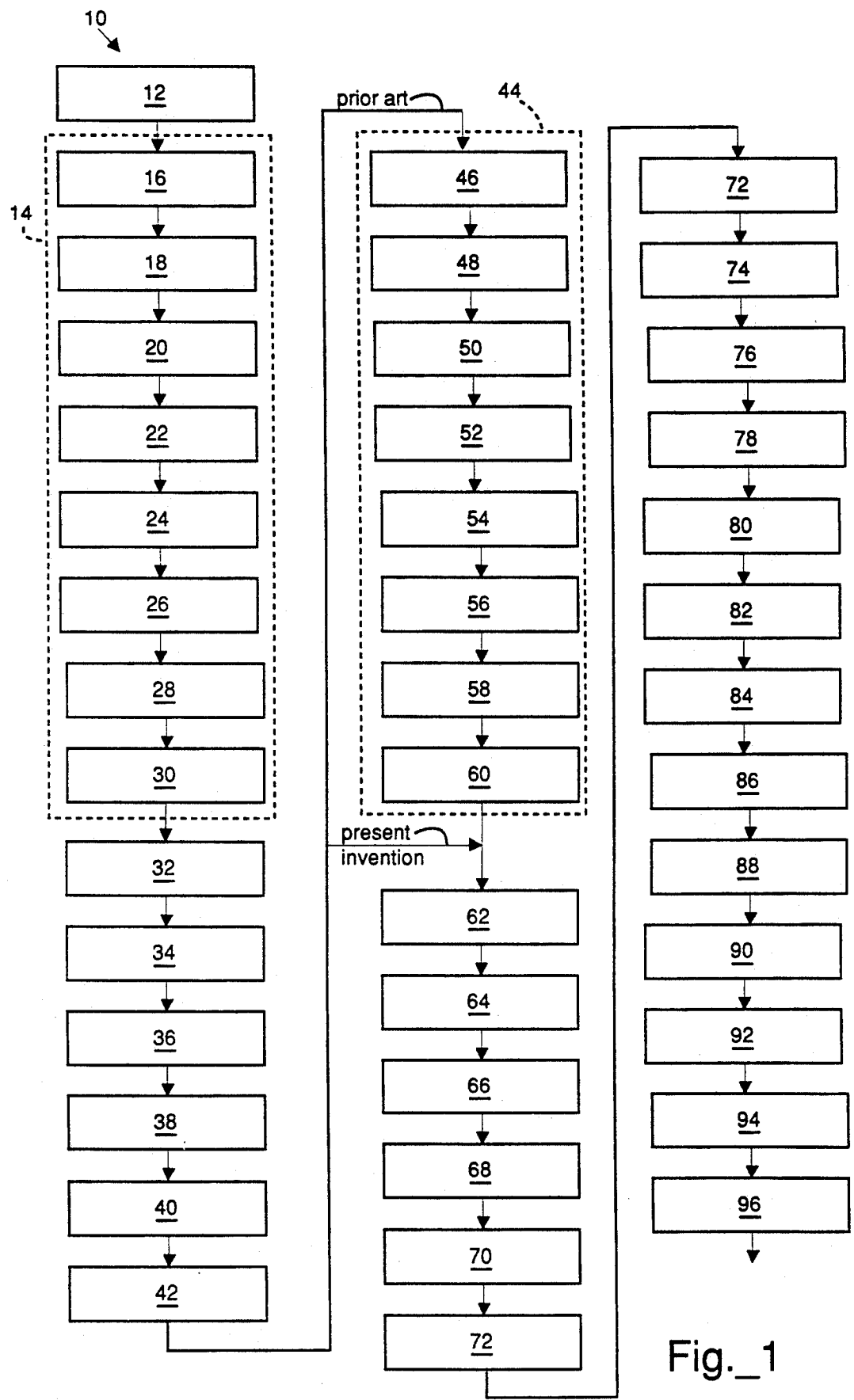
Fig._1

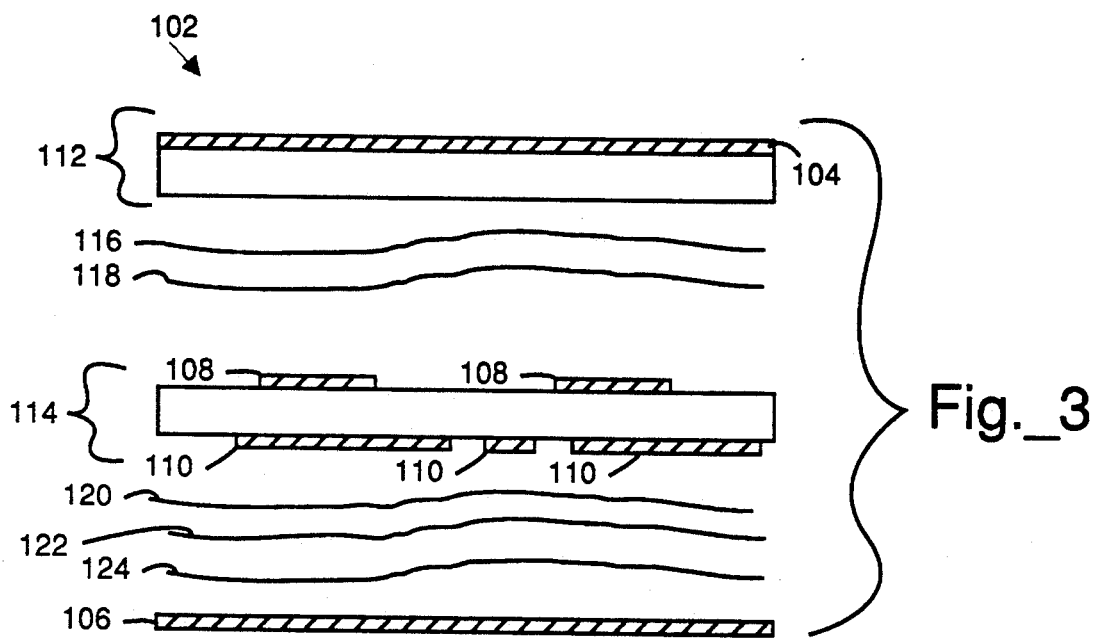
Fig._3
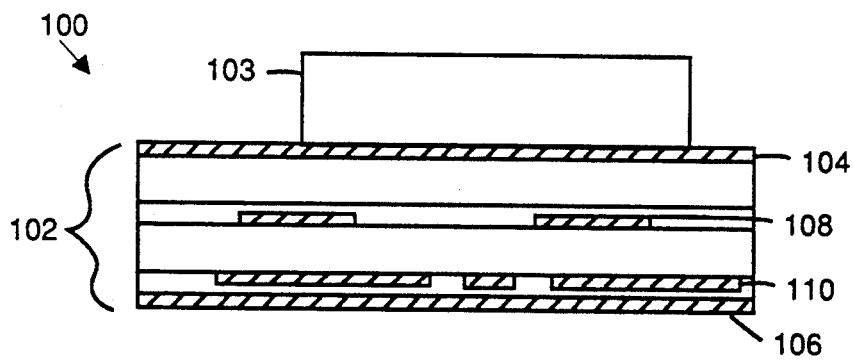
Fig._2

COPPER CLAD EPOXY PRINTED CIRCUIT BOARD SUITABLE FOR MICROWAVE FREQUENCIES ENCOUNTERED IN GPS RECEIVERS

BACKGROUND OF THE INVENTION

1. Field of the Invention

The invention relates generally to printed circuit boards (PCBs) and specifically to methods of producing copper clad epoxy PCBs suitable for use at the microwave frequencies processed in global positioning system (GPS) receivers.

2. Description of the Prior Art

Microwave circuit design has presented special challenges to circuit designers and manufacturing alike. At microwave frequencies, short wire leads appear to be significant inductors, stray capacitances become a major problem, and insulators and dielectrics can become lossy and become resistors. A phenomenon known as the "skin effect" causes currents in conductors to concentrate in the outer skin of the conductor more and more as the frequency increases. The vast majority of electronic circuit manufacturers have adopted the use of printed circuit boards (PCBs) as a quick, economical way to build circuits and systems. PCB construction is especially suited to high volume automated manufacturing, so devices using PCBs are inexpensive and affordable.

The most common materials used today are epoxy/fiberglass laminate boards with copper cladding on one or both sides. Photoresist is applied to the copper clad, and a pattern is used to expose the photoresist. A developer then hardens the exposed photoresist and the rest is washed away. A ferric chloride bath then is used to etch away the copper clad not protected by photoresist. The materials and techniques used make copper clad epoxy laminate PCBs a cost effective choice.

Ceramic and alumina substrates have been used almost exclusively as PCB substitutes at microwave frequencies because radio frequency (RF) losses are too great in the epoxy laminate. These substrates, however, are fragile and require expensive materials and manufacturing techniques to build electronic circuits. Multilayer thick film alumina circuits are possible, but because the internal conductive layers use molybdenum, conductor resistances are a problem. Such construction is not an alternative when one wishes to build low-cost, personal GPS receivers that are within the economic reach of the majority of casual users.

Prior art copper clad epoxy laminates used in the manufacture of multilayer packages comprise single and double-sided copper clad epoxy laminates that have only single-treated copper foil. These treated sides are inside the epoxy substrate copper clad. The treating of the copper foil aids in the bonding of the copper foil to the epoxy substrate. Multilayer package fabricators then will use a deliberate step of oxidation to oxidize the outside of the single treated copper foil so that prepreg glass can be used to bond to another single-sided copper clad laminate. The result is a single-treated copper foil with a thick oxide layer that winds up in the middle of a multilayer package where it can reduce propagation speeds and increase insertion losses in devices operating at microwave frequencies.

What is needed is a double treated copper clad epoxy laminate PCB and a method for making multilayer packages, such as is described below in connection with the present invention.

SUMMARY OF THE PRESENT INVENTION

It is therefore an object of the present invention to provide an inexpensive PCB that has good electrical characteristics at the microwave frequencies encountered in GPS receivers.

Briefly, a method for making printed circuit boards pursuant to a preferred embodiment of the present invention comprises using double treated copper foils for all inside conductor layers of multilayer packages with substrates of alloys of epoxy and polyphenylene oxide (PPO) resin to counteract the skin-effect encountered at high frequencies. Direct bonds between inside surfaces are then used while avoiding an oxide step that otherwise introduces red/brown or black oxides.

An advantage of the present invention is that less expensive manufacturing techniques and materials can be used in the production of GPS receivers and other microwave devices.

Another advantage of the present invention is that insertion losses and propagation speeds in the inner conductive layers of multilayer PCB packages are not worsened by oxide on the inner conductive layers.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a flowchart of a process according to a first embodiment of the present invention;

FIG. 2 is a cross-sectional view of a multilayer device made according to a second embodiment of the present invention; and FIG. 3 is a cross-section view showing the individual layers that comprise the multilayer PCB of FIG. 2.

DETAILED DESCRIPTION OF THE PREFERRED EMBODIMENTS

In FIG. 1, a first embodiment of the present invention is a process 10 for making a multi-layer printed circuit board (PCB) that comprises a rheologic bonding (under temperature and pressure), in a step 12, of a double-treated copper foil (available from Nippon Mining) to a substrate comprising an alloy of epoxy and polyphenylene oxide (PPO) resin (available under the GETEK trademark of General Electric Electromaterials) to make a copper clad laminate. Using double-treated copper foil is an important part of the present invention for the copper foil ultimately forms inside conductive layers of a multilayer package. Single-treated copper foil may be used for conductive layers that wind up on the outsides of the multilayer package.

A preclean sub-process 14 comprises baking the laminate, in a step 16, in an air-circulating oven for four hours at 325° F., dipping, in a step 18, the laminate in a preplating cleaner (e.g., a degreaser), in a step 20 rinsing the laminate in water, in a step 22, dipping the laminate in a microetch (e.g., a 5% solution), in a step 24, rinsing again in water, in a step 26 dipping the laminate in a copper conditioning bath (e.g., an antioxident), in a step 28, rinsing again in water, and in a step 30 drying in an air dryer.

In a step 32, a fully aqueous dry film is laminated onto the copper surfaces. In a step 34, the dry film laminate is exposed to ultra-violet light, using circuit wiring film patterns. In a step 36, the laminates are then photo-developed. In a step 38, a caustic stripper is used to wash away non-exposed areas. In a step 40, an alkaline etchant is used to remove the copper not protected by the remaining developed dry film. This is followed by a step 42 that strips off the remaining developed dry film. Copper traces now appear that mimic the film patterns.

The prior art uses an oxide subprocess 44 that comprises a step 46 in which the laminate is dipped in a preplating cleaner (e.g., a degreaser), a step 48 that rinses the laminate in water, a step 50 of dipping the laminate in a microetch (e.g., a 5% solution), a step 52 that rinses the laminate in water, a step 54 that rinses the laminate in de-ionized water, a step 56 that dips the laminate in a caustic soda solution (e.g., 10% solution), a step 58 that dips the laminate in a brown oxide, and a step 60 that dips the laminate in de-ionized water.

The first embodiment of the present invention does not include oxide subprocess 44, but rather proceeds directly from step 42 to a step 62 in which an air-circulating oven is used for thirty minutes at 260° F. to dry off excess moisture left over from the wet processes. Multilayer boards are then made in a step 64 by laying-up individual panels with copper clad on the outside of the stack. In a step 66, the layered boards are then laminated under pressure and heat, 200° C. for ninety minutes at 125 PSI, with a vacuum assist, or 200 PSI without. In a step 68, the flashing is then sheared off. In a step 70, holes are drilled for "vias" (connections between circuit layers) and component mounting, which may be accomplished by using FR-4 parameters. (Those skilled in the art are familiar with "FR-4".) In a step 72, resin smear inside the drilled holes is removed, thus exposing copper interconnects in the circuit layers. In a step 74, copper is electro-deposited inside the drill holes, thus completing the electrical connections between layers. In a step 76, the outermost copper layers are laminated with a fully aqueous dry film. In a step 78, the dry film laminate is exposed to ultra-violet light using additional film patterns. In a step 80, the outside layers are then photo-developed. In a step 82, a caustic stripper is used to wash away non-exposed areas. In a step 84, an alkaline etchant is used to remove the copper not protected by the remaining developed dry film. This is followed by a step 86 that strips off the remaining developed dry film. Copper traces (conductors) appear that mimic the additional proprietary film patterns. In a step 88, an air-circulating oven is used for thirty minutes at 260° F. to dry off excess moisture left over from the wet processes. In a step 90, a photo-imagable solder mask is screened on and heat cured in an air-circulating oven. In a step 92, a thin coating of 63% solder to 37% nickel is hot bathed into the exposed copper in the vias and elsewhere not protected by the solder mask. In a step 94, a continuity check of the board is done before routing each individual board from a frame of several. In a step 96, a final inspection completes the process.

The copper foil used in step 12 preferably has no layer of copper that has oxidized. It is conventional, prior art practice to grow a layer of oxide of copper on the copper foil to promote the adhesion (rheologic bonding) of the copper foil to the substrate. But at frequencies over one gigahertz, such an oxide layer interferes with high frequency currents that tend to flow on the outside surfaces of conductors due to a phenomenon known as the "skin effect". The complete elimination of the oxide layer is frequently not economically practical. However, available techniques can be employed (e.g., nitrogen atmospheres) to completely eliminate the growth of an oxide layer on the copper foil should the expense be justifiable. The elimination of the prior art steps of deliberately introducing oxide will produce some benefits. Using preclean subprocess 14 and eliminating oxide subprocess 44 reduces oxide layer thickness on the respective copper foil surfaces to under one thousand Angstroms (1000 Å).

The above steps that call for pressing, under temperature, the copper foil to the substrate, or laminates in stacks, can use either a Press Cycle A or a Press Cycle B, described below, and also publicly available in many commercial publications of GE in connection with GETEK. If presses are not available that can sustain temperatures of 375° F. in the materials, then Press Cycle A should be used. Otherwise, Press Cycle B should be used. These press cycles should result in good copper foil peel-off figures and proper bonding of the epoxy and polyphenylene oxide (PPO) resin alloy.

In Press Cycle A, the press temperature is 350° F. The starting low pressure is 25 PSI until the panel (laminate) temperature reaches 260° F. A high pressure of 200 PSI (125 PSI with vacuum assist) is then applied for thirty minutes with the material temperature above 340° F. The heat rise rate should be 10°–15° F. per minute. The cool down should be less than 10° F. per minute. A post bake of 390° F. with a minimum of 75 minutes at a material temperature of 375° F. should follow.

In Press Cycle B, the press temperature is 375° F. The starting low pressure is 25 PSI until the panel (laminate) temperature reaches 260° F. A high pressure of 200 PSI (125 PSI with vacuum assist) is then applied for 75 minutes with the material temperature above 370° F. The heat rise rate should be 10°–15° F. per minute from 175° F. to 275° F. The cool down should be less than 10° F. per minute. A post bake is not required.

In FIG. 2, a second embodiment of the present invention is a microwave device 100 that comprises a printed circuit board (PCB) 102 made by the above process 10. A module 103 operating at microwave frequencies uses a pair of outside conductors 104 and 106, and a pair of inside conductors 108 and 110 to carry signals in excess of one gigahertz. The PPO material in PCB 102 exhibits stable dielectric constants (DK) between one and twenty gigahertz, and has been tested to be about 3.2 with a dissipation factor of 0.01 to 0.015.

In FIG. 3, PCB 102 is shown to be comprised of a single-sided, single-treated copper clad laminate 112, a double sided, double-treated copper clad laminate 114, and oxided foil 106. A pair of plies of prepreg 116 and 118 (e.g., General Electric TO(B) prepreg 106 glass), are used between laminates 112 and 114. A pair of plies of prepreg 120 and 122 (e.g., General Electric TO(B) prepreg 106 glass) and a ply 124 of prepreg (e.g., General Electric T3(B) prepreg 2313 glass), are used between laminate 114 and outside conductor 106.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for fabricating a multilayer printed circuit board (PCB) package, the method comprising the steps of:
   bonding double-treated copper foil to a substrate of an alloy of epoxy and polyphenylene oxide (PPO) resin to form a first laminate;
   etching a circuit pattern in said double-treated copper foil; and
   direct bonding under heat and pressure the double-treated copper foil side of said first laminate to a second laminate comprised of an alloy of epoxy and polyphenylene oxide (PPO) resin.

2. The method of claim 1 wherein:
   the step of direct bonding comprises stripping developed dry film to create traces mimicking film patterns and then proceeding directly to drying said first laminate to remove excess moisture.

3. The method of claim 1, further comprising the step of:
   precleaning said first laminate before the step of etching.

4. The method of claim 3, wherein the step of precleaning comprises the constituent steps of:
   baking said first laminate in an air-circulating oven for approximately four hours at 325° F.;
   dipping said first laminate in a preplating cleaner;
   rinsing said first laminate in water;
   dipping the laminates in a microetch solution;
   rinsing said first laminate in water;
   dipping said first laminate in a copper conditioning bath;
   rinsing said first laminate in water; and
   drying said first laminate in an air dryer.

* * * * *